US009524799B2

(12) United States Patent
Desireddi et al.

(10) Patent No.: US 9,524,799 B2
(45) Date of Patent: Dec. 20, 2016

(54) METHOD AND APPARATUS TO TUNE A TOGGLE MODE INTERFACE

(71) Applicant: SanDisk Technologies Inc., Plano, TX (US)

(72) Inventors: Sateesh Desireddi, Andhra Pradesh (IN); Srinivasa Rao Sabbineni, Karnataka (IN); Shiv Harit Mathur, Karnataka (IN)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/739,836

(22) Filed: Jun. 15, 2015

(65) Prior Publication Data

US 2016/0189758 A1    Jun. 30, 2016

(30) Foreign Application Priority Data

Dec. 30, 2014 (IN) .......................... 4224/MUM/2014

(51) Int. Cl.
| | |
|---|---|
| *G11C 29/08* | (2006.01) |
| *G11C 29/02* | (2006.01) |
| *G11C 5/06* | (2006.01) |
| *G11C 7/22* | (2006.01) |

(52) U.S. Cl.
CPC ............. *G11C 29/025* (2013.01); *G11C 5/063* (2013.01); *G11C 7/222* (2013.01); *G11C 2207/105* (2013.01)

(58) Field of Classification Search
CPC ................................ G11C 7/222; G11C 29/08

USPC ..................................................... 365/193, 201
See application file for complete search history.

(56) References Cited

U.S. PATENT DOCUMENTS

| | | | | |
|---|---|---|---|---|
| 6,801,869 | B2 * | 10/2004 | McCord | G01R 31/318505 702/117 |
| 7,663,946 | B2 * | 2/2010 | Kim | G11C 7/1078 365/194 |
| 8,233,336 | B2 * | 7/2012 | Mueller | G06F 13/1694 365/189.07 |
| 8,971,134 | B2 * | 3/2015 | Mueller | G06F 13/1694 365/191 |
| 9,177,623 | B2 * | 11/2015 | Pandey | G11C 7/227 |

* cited by examiner

*Primary Examiner* — Michael Tran
(74) *Attorney, Agent, or Firm* — Brinks Gilson & Lione

(57) ABSTRACT

Methods and apparatuses for performing receive and transmit path tuning of a toggle mode interface between a primary controller and a secondary controller is disclosed. A first component having a variable setting and connected with a data bus of the interface is iteratively adjusted. For each setting of the first component, test data written to the secondary controller and a delay unit having a variable delay setting and connected with a strobe line of the interface is adjusted. Delay settings are identified where the read data is equal to the written data. Settings for the first component and corresponding delay setting that produce the largest range of delay settings where the read data is equal to the written data is selected. The first component may correspond to a driver unit in the primary controller or an ODT unit in the secondary controller.

22 Claims, 8 Drawing Sheets

METHOD AND APPARATUS TO TUNE A TOGGLE MODE INTERFACE

PRIORITY

This application claims priority to Indian Patent Application No. 4224/MUM/2014, entitled "METHOD AND APPARATUS TO TUNE A TOGGLE MODE INTERFACE," filed on Dec. 30, 2014, the entire disclosure of which is hereby incorporated by reference.

TECHNICAL FIELD

This application relates generally to memory devices. More specifically, this application relates to identifying optimal values to operate an interface using toggle mode.

BACKGROUND

Non-volatile memory systems, such as flash memory, have been widely adopted for use in consumer products. Flash memory may be found in different forms, for example in the form of a portable memory card that can be carried between host devices or as a solid state disk (SSD) embedded in a host device.

Consumer products store and retrieve increasing amounts of data from flash memory. Examples of data intensive operation includes storing a photograph or video to a flash memory or retrieving music files stored in the flash memory. It is desirable to improve the data rates at which data can be stored and retrieved from the flash memory.

SUMMARY

According to one aspect, a method for performing receive path tuning of a toggle mode interface is disclosed. Test data is written via a data bus to a storage location. The data bus is coupled with a termination unit. A delay unit is coupled with a strobe line, which is also coupled with a termination. The termination unit has a plurality of termination settings wherein each of the plurality of termination settings presents a different impedance value. For each of the plurality of termination settings of the termination unit, data is read from the storage location; and a range of delay settings for the delay unit where the read data is equal to the test data is identified. The termination setting having a greatest range of delay settings where the read data is equal to the test data is selected.

In accordance with another aspect, a method for performing transmit path tuning of a toggle mode interface is disclosed. For each of a plurality of drive settings for a driver unit, test data is written via a data bus to a storage location and read back. The data bus is coupled with the driver unit and a delay unit is coupled with a strobe line. The strobe line driver is tuned along with the data bus driver. Between writing the test data and reading the data, a delay setting of the delay unit is incremented. For each driver setting, a range of delay settings for the delay unit where the read data is equal to the test data is identified. Finally, the one of the plurality of driver settings having a greatest corresponding range of delay settings is selected.

In accordance with yet another aspect, a device for performing receive path tuning of a toggle mode interface is disclosed. The device comprises a primary controller and a secondary controller. The primary controller includes a delay unit operable to delay the transmission of a strobe signal communicated by a strobe line. The delay unit is characterized by a range of delay settings. The secondary controller is in communication with the primary controller via a data bus and the strobe line. The secondary controller includes an on device termination (ODT) unit coupled with the data bus and/or the strobe line. The ODT unit is operable to adjust an impedance of the data bus. The ODT unit is characterized by a plurality of termination settings wherein each of the plurality of termination settings presents a different impedance value. The primary controller is configured to write test data via the data bus, to a storage location in the secondary controller. The primary controller is configured to instruct the secondary controller to change the termination settings and at each of the plurality of termination settings, the primary controller is configured to read data via the data bus from the storage location. For each of the plurality of termination settings, the primary controller is configured to identify a range of delay settings for the delay unit where the read data is equal to the test data. Finally, the primary controller is configured to select the one of the plurality of termination settings having a greatest range of delay settings.

In accordance with still another aspect, a device for performing transmit path tuning of a toggle mode interface is disclosed. The device comprises a primary controller and a secondary controller. The primary controller includes a delay unit and a driver unit. The delay unit is operable to delay the transmission of a strobe signal communicated by a strobe line. The delay unit is characterized by a range of delay settings. The driver unit is operable to adjust a respective current drive of a data bus. The driver unit characterized by a plurality of drive settings, wherein each of the plurality of drive setting generates a different current drive. The secondary controller is in communication with the primary controller via the data bus and the strobe line. The primary controller is configured to write test data via the data bus, to a storage location in the secondary controller; change the drive setting; at each of the plurality of drive settings and read data via the data bus from the storage location. For each of the plurality of drive settings, the primary controller is configured to identify a range of delay settings for the delay unit where the read data is equal to the test data. Finally the primary controller is configured to select the one of the plurality of termination settings having a greatest range of delay settings.

BRIEF DESCRIPTION OF THE PRESENTLY PREFERRED EMBODIMENTS

Figure 1:
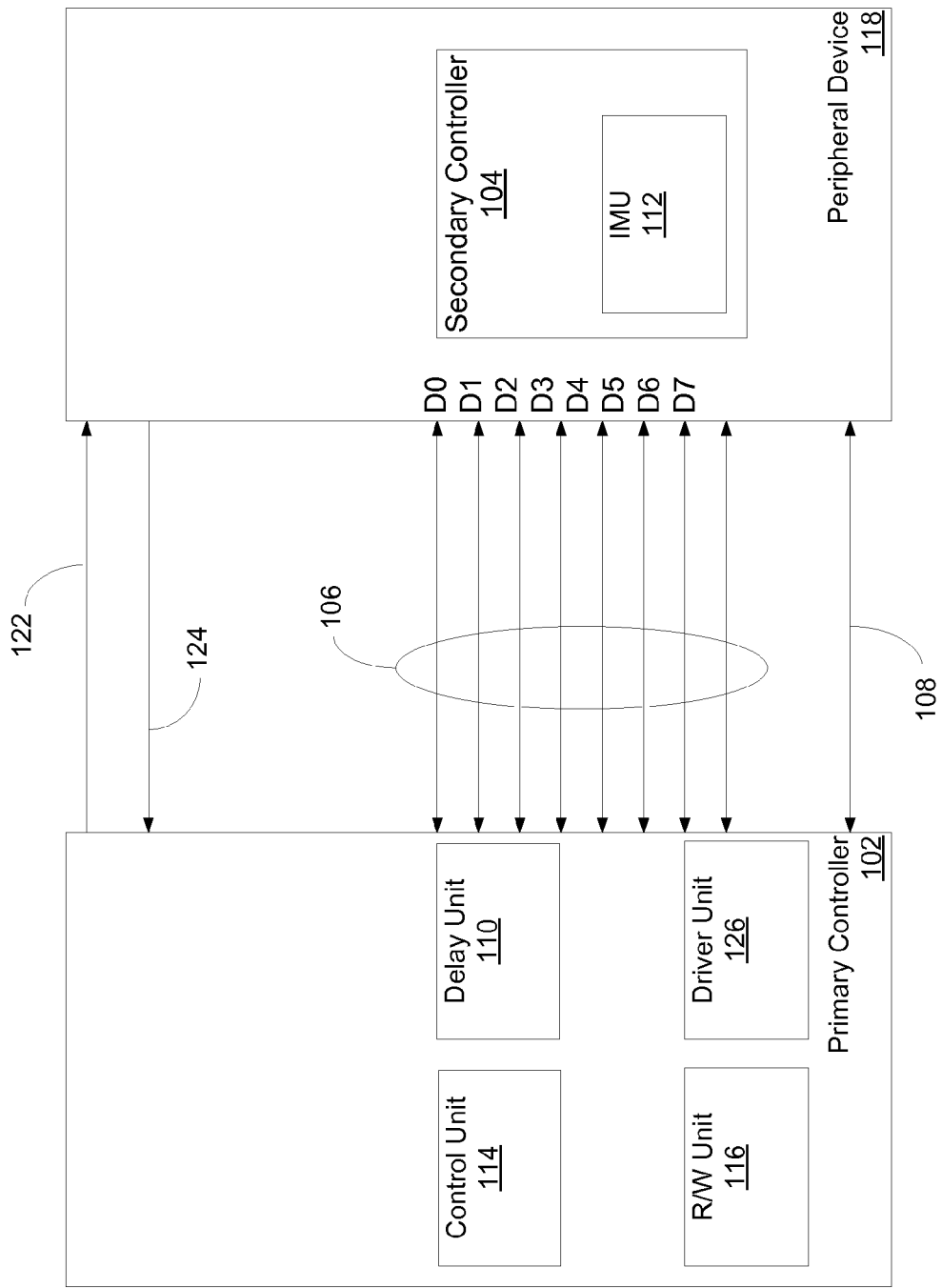
FIG. 1 is a block diagram of an exemplary system comprising a primary controller and secondary controller that may exchange information using the several operating modes disclosed herein.

Disclosed herein are methods for controlling and adjusting the relative timing between control signals and data signals communicated between two controllers. System 100 depicts an exemplary system that may implement methods for adjusting the relative timing of data signals communicated between primary controller 102 and secondary controller 104 via data bus (DQ) 106 and data strobe (DQS) line 108. In the foregoing discussion, the data bus 106 and the DQS line 108 may be collectively referred to as an interface. In an exemplary embodiment, primary controller 102 may be implemented as an application specific integrated circuit (ASIC). In an exemplary embodiment, secondary controller 104 may be included in a peripheral device 118 and may control the operation of the peripheral device 118. By way of example and without limitation, data communication via a parallel byte-wide data bus is described. Other bus widths are contemplated.

In an exemplary embodiment, primary controller 102 includes a control unit 114, read-write (R/W) unit 116, delay unit 110 and driver unit 126. In this embodiment, secondary controller 104 includes an impedance matching unit (IMU) 112. In an exemplary embodiment, R/W unit 116 operates to instruct secondary controller 104 to perform device specific actions on peripheral device 118.

In an exemplary embodiment, componentry in the driver unit 126 and IMU 126 may be electrically connected with each of the lines of data bus (DQ) 106 and DQS line 108. In this embodiment, componentry in the delay unit 110 may be connected with the DQS line 108. Thus adjustments made to the settings of the driver unit 126 and the IMU 126 units may cause changes in the characteristics of the lines of data bus (DQ) 106. Adjustments made to the settings of the delay unit 110 may delay the transmission of a DQ signal on the DQS line 108. In an exemplary embodiment, control unit 114 operates to configure the settings of the driver unit 126, delay unit 126 and IMU 112. In this embodiment, primary controller 102 may instruct secondary controller 104 to appropriately configure the settings of the IMU 112.

For example, primary controller 102 may operate the delay unit 110 to delay the DS signal transmitted via the DQS line 108 relative to the data signals communicated via the data bus 106. In an exemplary embodiment, delay unit 110 may include several delay elements. Impedance matching unit (IMU) 112 may include one or more variable impedance elements. Settings of the impedance matching unit (IMU) 112 may be adjusted to change the electrical and transmission characteristics of the data lines of the data bus 106. Settings of the driver unit 126 may be adjusted to change the drive current sourced by the respective data line connected to the driver unit 126. As will be explained in detail below, settings of the driver unit 126, delay unit 110 and IMU 112 may be dynamically optimized to control the relative timings of the data signals communicated between primary controller 102 and secondary controller 104 via data bus (DQ) 106 and data strobe (DQS) line 108.

In an embodiment, primary controller 102 and secondary controller 104 exchange data and commands via data bus 106. Exchange of data, address and commands may be accomplished using one of two modes of operation—legacy mode or toggle mode.

In a legacy mode of operation, address, data and command exchange is accomplished by activating one of the write enable line (WEn) 122 or read enable line (REn) 124. WEn 122 and REn 124 may be referred to as legacy mode control lines. To write data to secondary controller 104 in legacy mode, primary controller 102 writes the data to DQ 106 and activates the WEn line 122. To read information from secondary controller 104, in legacy mode, a read command may be written to secondary controller 104 and the data may be read back via DQ 106 by activating REn line 124. Importantly, in legacy mode of operation, data and commands are written to and read from secondary controller on the rising edge or the falling edge of signals communicated on the legacy mode control lines, write enable line (WEn) 122 or read enable line (REn) 124, respectively. In one example, data bytes 0xAA (b10101010), 0x55 (b01010101) and 0xAA (b10101010) may be sequentially written to data lines D0-D7. Primary controller 102 may write data byte 0xAA to data bus 106 and data lines that are asserted high i.e. D1, D3, D5 and D7 may not instantaneously transition to the active high state. Instead the transition may occur gradually. The voltage transitions on the different data lines may have different slopes, in part because of differing electrical and transmission characteristics of the different data lines. The rate of change of the voltage or slope of the voltage transition may be referred to as the slew rate of the line. Primary controller 102 may drive a signal on the WEn line 122. Memory controller 102 delays the driving the signal on the WEn line 122 to ensure, in part, that the voltage levels on the data lines are stable and that the data lines are in the logic state corresponding to the data being written. In one embodiment, when the signal level on the WEn line 122 exceeds a voltage threshold, secondary controller 104 may latch the state of the data lines and read the latched data. In an exemplary embodiment, WEn line 122 may be activated corresponding to the time when the signal levels on the data lines D0-D7 have reached their steady state levels corresponding to the data written i.e. 0XAA.

In the toggle mode of operation, primary controller 102 activates the DQS line 108 in conjunction with the data lines 106 to perform data read and write operations from and to secondary controller 104. The data read may be the result of the primary controller 102 instructing secondary controller 104 to perform a function specific to the peripheral device 118. DQS line 108 may be referred to as a toggle mode control line. Address and command information may be written to peripheral controller 118 using the legacy mode of writing by activating the WEn line 122. Importantly, in the toggle mode of operation, data is read or written by primary controller 102 during both the rising and falling edge of the signal driven on DQS line 108. The toggle mode may also be referred to as a dual data rate mode because the throughput of an interface for exchanging data is twice that for the legacy mode. In an embodiment, data exchange via data bus 106 may be controlled by activating the DQS line 108 at the appropriate time. Activating the DQS 108 is achieved by driving an electrical signal on the DQS line 108. The signal driven on the DQS line 108 may be referred to as the data strobe (DS) signal.

In the toggle mode of operation of DQS line 108, primary controller 102 may write a data byte to data lines D0-D7 and drive an active high signal on DQS line 108. In response to detecting a voltage on the DQS line 108 that exceeds a threshold voltage, peripheral controller 118 may latch the data lines D0-D7 and read the data byte. Subsequently, primary controller may write the next data byte to data lines D0-D7 and drive an active low signal on DS 108. In response to detecting a voltage on the DQS line that is below a threshold voltage, secondary controller 104 may latch the data lines D0-D7 and read the next data byte. Thus, in the toggle mode of operation data is communicated between the primary and secondary controller during both the rising and falling edge of DS 108.

Figure 2:
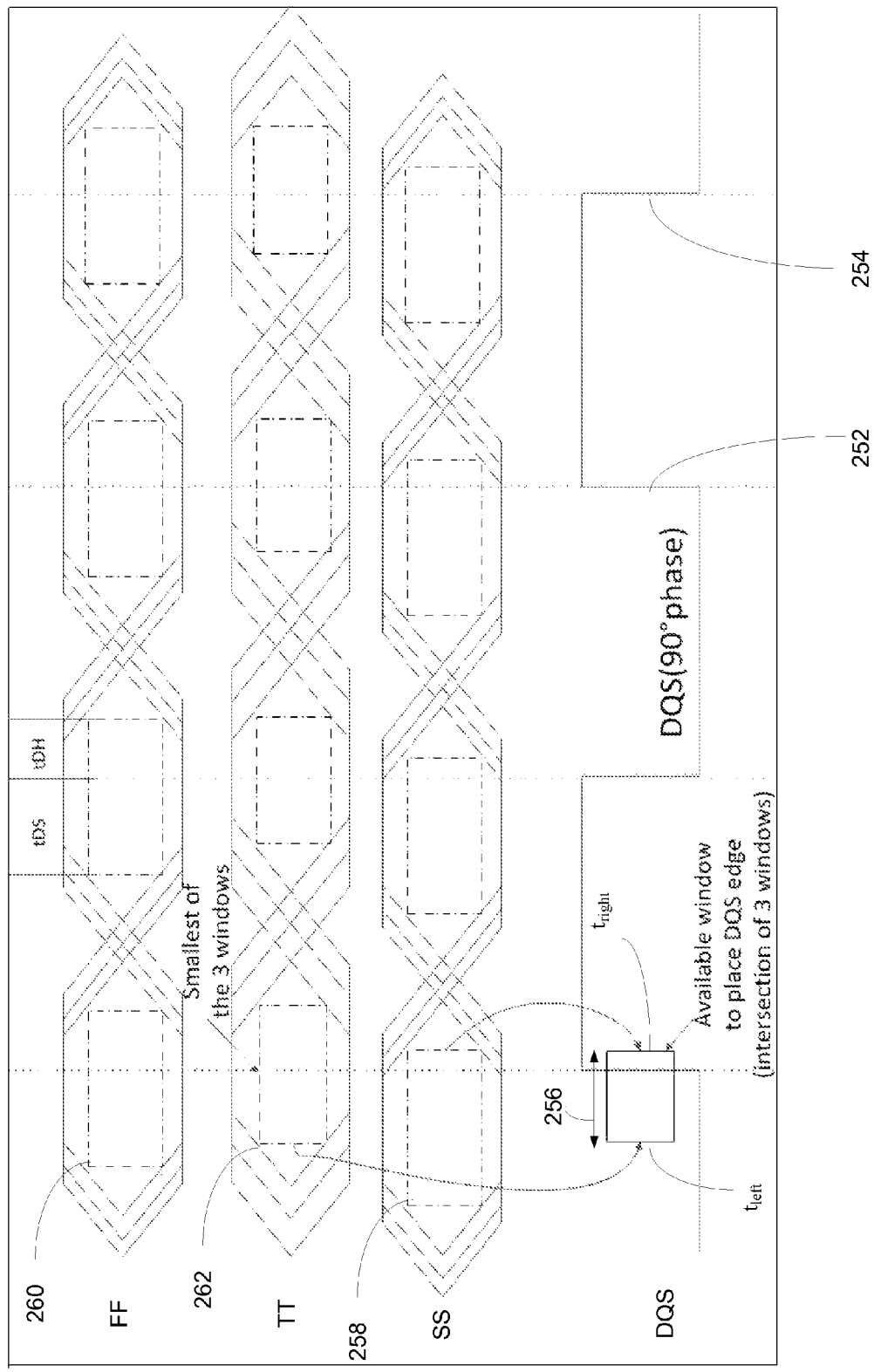
FIG. 2 is a timing diagram of a toggle mode of operating an interface between an exemplary primary controller and secondary controller.

Timing diagram 250 of FIG. 2 illustrates the timing of the data signals on DQ lines 106 and DQS 108 when performing write operation in the toggle mode of operation, in accordance with one embodiment. This example timing diagram depicts the variation across process (F/T/S) corners. FF refers to fast, TT refers to typical, and SS refers to slow. The IOs (e.g. D0-D7) may be shown as one bus. Variation of the phase of the DQ eye with respect to DQS may depend on Process, Voltage or Temperature (PVT). As described, identification of the positioning of DQS may be for any given PVT.

One DLL setting may be used for assessing available margin across process corners. Because of the process variations, even if the margins are positive, the window in which DQS can safely capture DQ may differ across processes. Accordingly, the effective window in which DQS can safely capture the data may be an intersection of individual timing windows. In one embodiment, a determination of the actual window may be made in real time and the DQS is placed at the middle of the window, resulting in unique DLL setting across process. The maximum data rate may be achieved by the smallest of individual timing windows rather than the intersection of the individual timing windows. The transmit link and receive link may see different drivers, receivers and parasitics, which result in different optimal locations for placing the DQS. It may be optimal to determine the actual timing windows for both write and read rather than using one DLL setting.

In response to detecting that the DS signal on DQS line 108 has transitioned to an active state, logic high for example, peripheral controller 118 may latch the state of the data lines in response to detecting the active state or the rising edge on the DQS line 108. The active state typically corresponds to a threshold voltage level. As previously explained in toggle mode, data is latched, read or written, on both the rising edge 252 and the falling edge 254 of the signal on DQS 108. In order for the correct data to be read or written, the activation of the DQS signal may be delayed until the data on the data lines are stable. If the primary controller 102 activates the DQ on the DQS line 108 prematurely, peripheral controller 118 may latch the data on data lines before the correct data appears on the data lines 106. As previously explained, the signals on the respective data lines may settle at their respective desired values at different rates. It is particularly desirable to activate the DQS line 108 nearly simultaneously when data is written to the data lines 106.

FF (Fast process and Temp.) is D0-D7 with window 260. TT is D0-D7 at typical process and temperature with an edge 262, and SS is at slow process and temperature with edge 258. Edge 258 represents arrival of all D0-D7 for safe capture by DQS. The edge 256 represents an available window placed at the DQS edge at an intersection of all three windows. As shown in FIG. 2, the signal level for slow processing SS stabilizes first at time 258, next the signal level of fast processing FF, which stabilizes at time 260 and lastly the signal level of the typical processing stabilizes at time 262.

The time 262 represents the earliest time that TT signal on DQS line 108 may be transitioned after the data is written to the data lines to ensure that the correct data is read or written. The time of activation of the left edge of DQ signal on DQS line may be represented by value $t_{left}$. Similarly, it is desirable to determine how late $t_{right}$ after the data is written to data lines, the signal on DQS line 108 may be transitioned to cause the correct data to be latched. Based on the determined $t_{left}$ and $t_{right}$ values, primary controller 102 may delay activation of the signal on DQS line 108 by a time value that is anywhere between the determined $t_{left}$ and $t_{right}$ values. Each time value may be referred to as an edge and the difference between time value $t_{left}$ and $t_{right}$ 256 may be referred to as the window or eye 256. Activation at any time during the window 256 may result in the correct data being latched.

In an exemplary embodiment, primary controller 106 may dynamically adjust the setting of the delay unit 110 and the driver unit 126 to determine settings that result in the maximum value for window 256 when writing data to secondary controller 104. The process of adjusting the setting to maximize the value of window 256 may be referred to as write tuning or toggle mode transmit path tuning.

In another exemplary embodiment, primary controller 106 may dynamically adjust the setting of the delay unit 110 and the IMU 112 to determine settings that result in the maximum value for window 256 when reading data from secondary controller 104. This process of adjusting the setting to maximize the value of window 256 may be referred to as read tuning or toggle mode receive path tuning.

Figure 3:
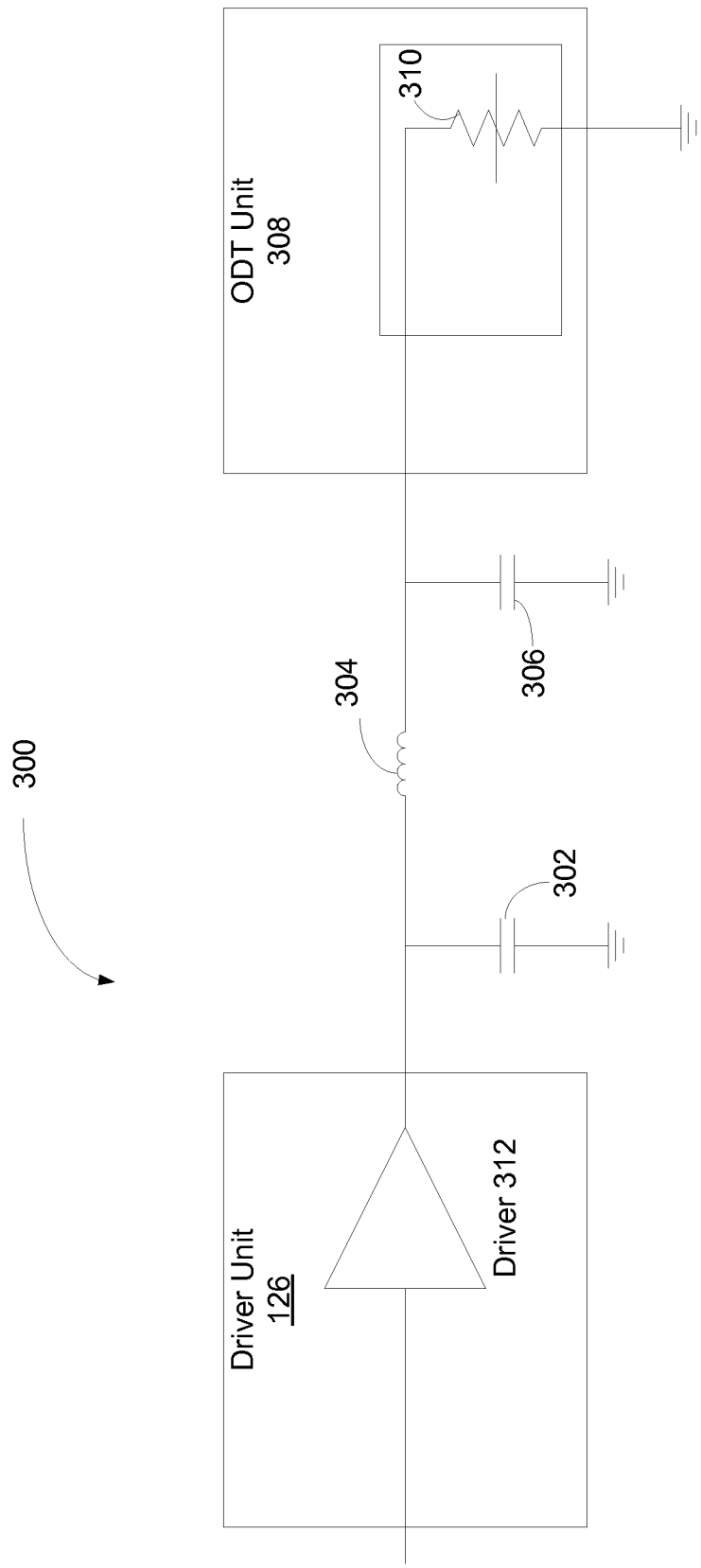
FIG. 3 is a block diagram of a data line and an exemplary on-device termination (ODT) unit.

FIG. 3 illustrates an exemplary data line 300. In an embodiment, data line 300 may correspond to data line D0 of FIG. 1. In this embodiment, data line 300 is connected between primary controller 102 and secondary controller 104. Inductor 304 and capacitors 302 and 306 represent the lumped impedance of the data line 300. The lumped impedance may cause the previously discussed slew rate when the data line signal transitions from one logic state to another. Separately, impedance mismatches between the output of the primary controller 102 and the input of the secondary controller 104 may cause reflections and ringing of the signals on the data lines.

The signals on the respective data lines may settle at their respective desired values at different rates because of differences in the electrical and transmission characteristics of the respective data lines. Additionally, electrical and transmission characteristics associated with a data line may vary with time. The variations may be caused by environmental, electrical and process variations. Adjustment of the electrical and transmission characteristics of a data line may be performed to match the input/output (I/O) impedances presented by the primary controller 102 and secondary controller 104. Matching the electrical and transmission characteristics allows for maximum transmission of electrical energy and prevents reflections on the data line.

In an exemplary embodiment, secondary controller 104 may include an on-chip device termination (ODT) 308. In an embodiment, IMU 112 of FIG. 1 may comprise several ODTs 308. In this embodiment, control unit 114 may instruct secondary controller 104 to adjust settings of the ODT 308. ODT 308 may include a variable impedance element 310. The variable impedance element 310 may be adjusted to match the output impedance presented by primary controller 102 and the input impedance presented by secondary controller 104. Variable impedance element 310 may comprise a variable series resistance and a variable parallel resistance. The series resistance may be varied to match the impedance between primary controller 102 and secondary controller 104. The parallel resistance may be varied to reduce the reflections when a signal is communicated on data line 300. The variable impedance element 310 may be adjusted in discrete steps. Thus each step may be associated with a corresponding impedance. The difference in the impedance produced when going from a first step to a second step represents the impedance change. The variable impedance element 310 may be characterized by M steps where each step couples an increasing amount of impedance to data line 300. Each step may correspond to a setting of ODT 308.

In an exemplary embodiment, control unit 114 may cause secondary controller 104 to adjust the variable impedance element 310 of ODT 308 to minimize the slew rate and the reflections produced when transitioning the voltage level on the data line 300 from logic high to a logic low state and vice versa.

In an exemplary embodiment, driver unit 126 may include several drivers. A driver may be connected with a respective data line of data bus 106 and DQS 108. Driver 312 is an exemplary driver that may be connected with data line 300. An output of the driver 312 may be connected with data line 300. An input of driver 312 may be connected with componentry of the R/W unit 116 and control unit 114 for example. Any one of the R/W unit 116 or control unit 114 may generate a signal for transmission to secondary controller 104 via data line 300. In an exemplary embodiment, the generated signal may be coupled with the input of driver 312. Driver 312 may couple this signal with the output of driver 312. Driver 312 operates to increase the current sourced at the output of driver 312. The current sourcing capability of driver 312 may be referred to as the current drive. In an exemplary embodiment, the current drive of drive 312 may be controlled by control unit 114. The current drive in conjunction with the lumped impedance of data line 300 determines the shape of the signal when the signal level on data line 300 transitions from one state to another state. The current drive may be incremental adjusted to produce a smooth transition. In an exemplary embodiment, the current drive of driver 312 may be incremented in N steps with each step producing a proportional increase in the current sourced.

Figure 4:
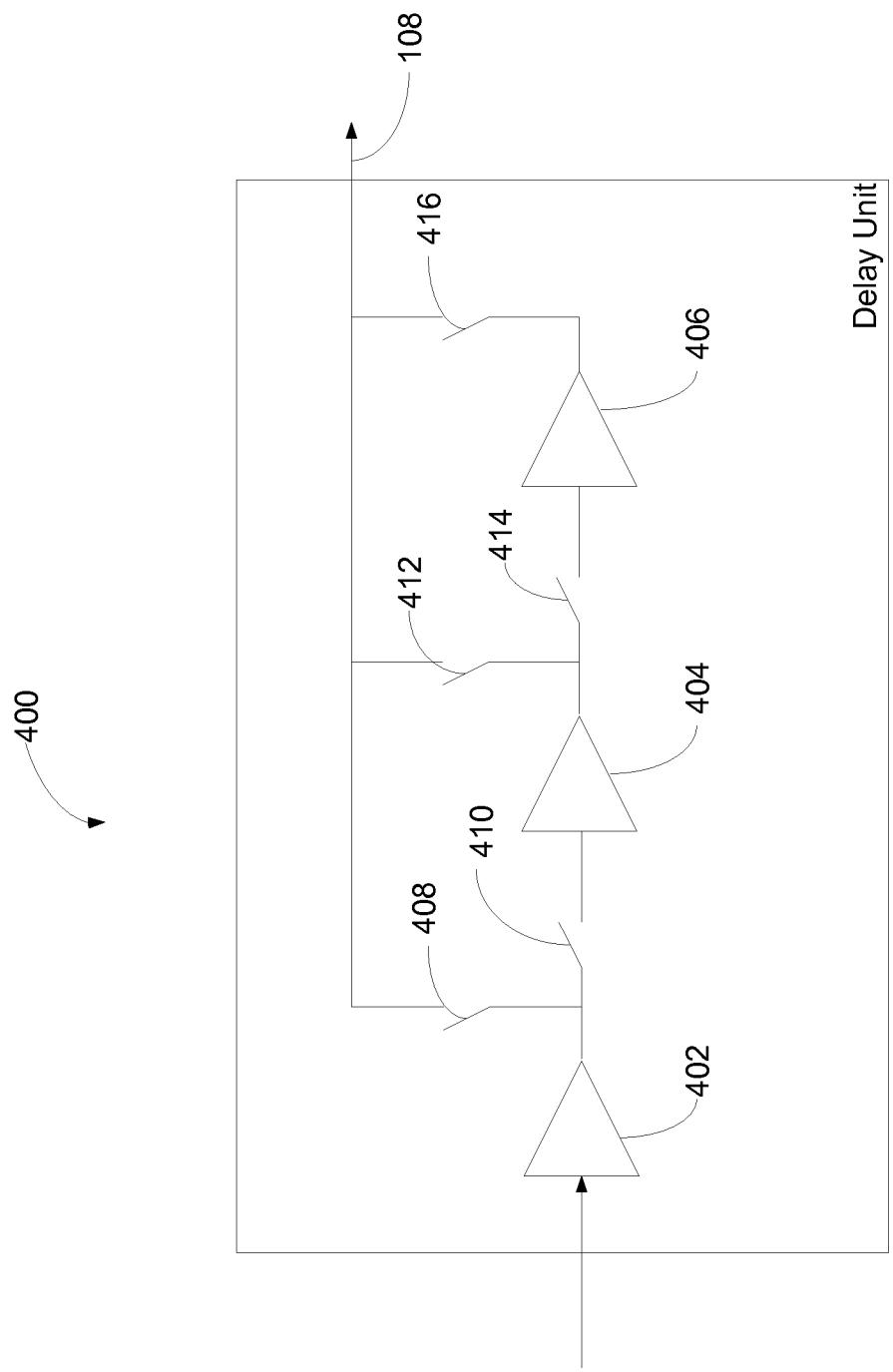
FIG. 4 is a block diagram of an exemplary delay unit that may be implemented in primary controller of FIG. 1.

FIG. 4 is block diagram of an exemplary delay unit 400. Delay unit 400 may correspond to the delay unit 110 of FIG. 1. In this embodiment, control unit 114 may operate delay unit 400 to increase or decrease the delay between writing of data to data lines 106 and activation of the DS signal driven on DQS line 108. In an exemplary embodiment, delay unit 400 may delay transmission of the DQ signal via the DQS line 108.

By way of example and without limitation, in an embodiment, delay unit 400 may comprise three logic buffers 402, 404 and 406. Each logic buffer is provided with an input and an output. Generally, the logic level of the signal at the output or simply the output signal level of a logic buffer tracks or follows the logic level of the signal applied to the input or simply the input signal level of the logic buffer. However, when the input signal level changes, for example from high to low, the change in output signal level of the logic buffer is delayed by a time period. The delay introduced between a change in the input signal level and the corresponding change in the output signal level may be referred to as the propagation delay. The value of this delay is a characteristic of the logic buffer. For example, the value of propagation delay introduced by a TTL logic buffer is 10 nanoseconds. Each logic buffer 402, 404, 406 functions as a delay element. The logic buffers 402, 404, 406 are shown as one example of a type of delay element and other means of delaying the data strobe signal are contemplated in alternative embodiments.

In an embodiment, the propagation delay introduced by logic buffer 402, for example, may be used to delay activation of the DQS signal. The duration of delay may be increased by causing the DQS signal to be serially communicated through several logic buffers. In an embodiment, switch 410 may be operated by control unit 114 to connect the output of logic buffer 402 to the input of logic buffer 404 causing the DS signal to traverse two logic buffers 402 and 404. Switch 414 may also be operated to connect the output of logic buffer 404 to the input of logic buffer 406 causing the DS signal to additional traverse logic buffer 406 thereby further delaying transmission of the DS signal.

In an embodiment, control unit 114 of FIG. 1 may close switch 408 and open switch 410 to cause DS signal to be delayed by the propagation delay of logic buffer 402. This setting of the switches of the delay unit 400 may be referred to as a delay setting. Control unit 114 may open switches 408 and 414 and close switch 412 to cause DS signal to be delayed by the cumulative propagation delays of logic buffers 402 and 404. This setting of the switches of the delay unit 400 may correspond to another delay setting. Control unit 114 may open switches 408 and 414 and close switches 410 and 412 to cause DS signal to be delayed by the cumulative propagation delays of logic buffers 402 and 404. Control unit 114 may open switches 408 and 412 and close switches 410, 412 and 416 to cause DS signal to be delayed by the cumulative propagation delays of logic buffers 402, 404 and 406. This setting of the switches of the delay unit 400 may correspond to yet another delay setting. Switching in additional logic buffers by appropriately operating the switches has the effect of increasing the delay period 214 (FIG. 2). Removing logic buffers by appropriately operating the switches has the effect of increasing the delay period 214 (FIG. 2). The number of logic buffers switched into the signal path may correspond to a setting of delay unit 410. Three logic buffers are simply provided by way of example and other numbers or types of signal delay mechanisms may be implemented in alternative embodiments.

In embodiments described herein, primary controller 102 may tune the interface comprising data bus 106 and DQS line 108 by writing data to secondary controller 104 in the legacy mode of operation and repeatedly reading the written data back in the toggle mode of operation. In one embodiment, after initializing the delay unit 400 with the maximum delay setting, the delay unit 400 may be operated to decrease the relative delay between activation of the DS signal driven on DQS line 108 and reading of data of the data lines 106. After each decrease in the relative delay, data may be read back from the secondary controller 106 in toggle mode and the read data may be compared with the written data. The smallest relative delay which results in the read data being equal to the written data may be used in all subsequent toggle mode read operation by the primary controller 102. As used herein equal means that the test data written to a location is the same as the test data read out from that location. This may be determined by performing a comparison, arithmetic or bitwise for example, between the written test data and the read data. Tuning the interface to optimize toggle mode read operations may be referred to as read tuning or receive path tuning. The tuning processes and systems described herein include procedures for testing read and write accuracy and selecting settings for the interface between the primary and secondary controllers where accurate reads and writes may occur.

In this embodiment, after read tuning, primary controller 102 may tune the interface by repeatedly writing data to secondary controller 104 in toggle mode and read the written data back in toggle mode. When writing data, the delay unit 400 may be initialized with the maximum delay setting. Before reading the written data back, the delay unit 400 may be configured with delay settings that were arrived at during the read tuning operation. After each read operation, the data that was written may be compared with the read data. While the read data is equal to the written data, the delay setting of the delay unit 400 may be decreased until the read data is no longer equal to the written data. The smallest relative delay which results in the read data being equal to the written data may be used in all subsequent toggle mode write operation by the primary controller 102.

In another embodiment, read and write tuning may be performing using the ODT unit 400. In this embodiment, the ODT unit 300 may be initialized with the maximum impedance setting of variable impedance element 310. After initializing the ODT unit 300, primary controller 102 may write data to the secondary controller 104 in legacy mode. The ODT unit 300 may be operated to decrease the impedance setting of variable impedance element 310. After each change in the impedance setting, data may be read back from the secondary controller 106 in toggle mode and the read data may be compared with the written data. The smallest impedance which results in the read data being equal to the written data may be used in all subsequent toggle mode read operation by the primary controller 102.

In this embodiment, after read tuning, primary controller 102 may further perform transmit path tuning of the interface by repeatedly writing data to secondary controller 104 in toggle mode and reading the written data back in toggle mode. When writing data, ODT unit 300 may be initialized with the maximum impedance setting of variable impedance element 310. Before reading the written data back, ODT unit 300 may be configured with impedance settings that were arrived at during the read tuning operation. After each read operation, the data that was written may be compared with the read data. While the read data is equal to the written data, the impedance setting of the ODT unit 300 may be decreased until the read data is no longer equal to the written data. The smallest impedance setting which results in the read data being equal to the written data may be used in all subsequent toggle mode write operation by the primary controller 102.

Figure 5:
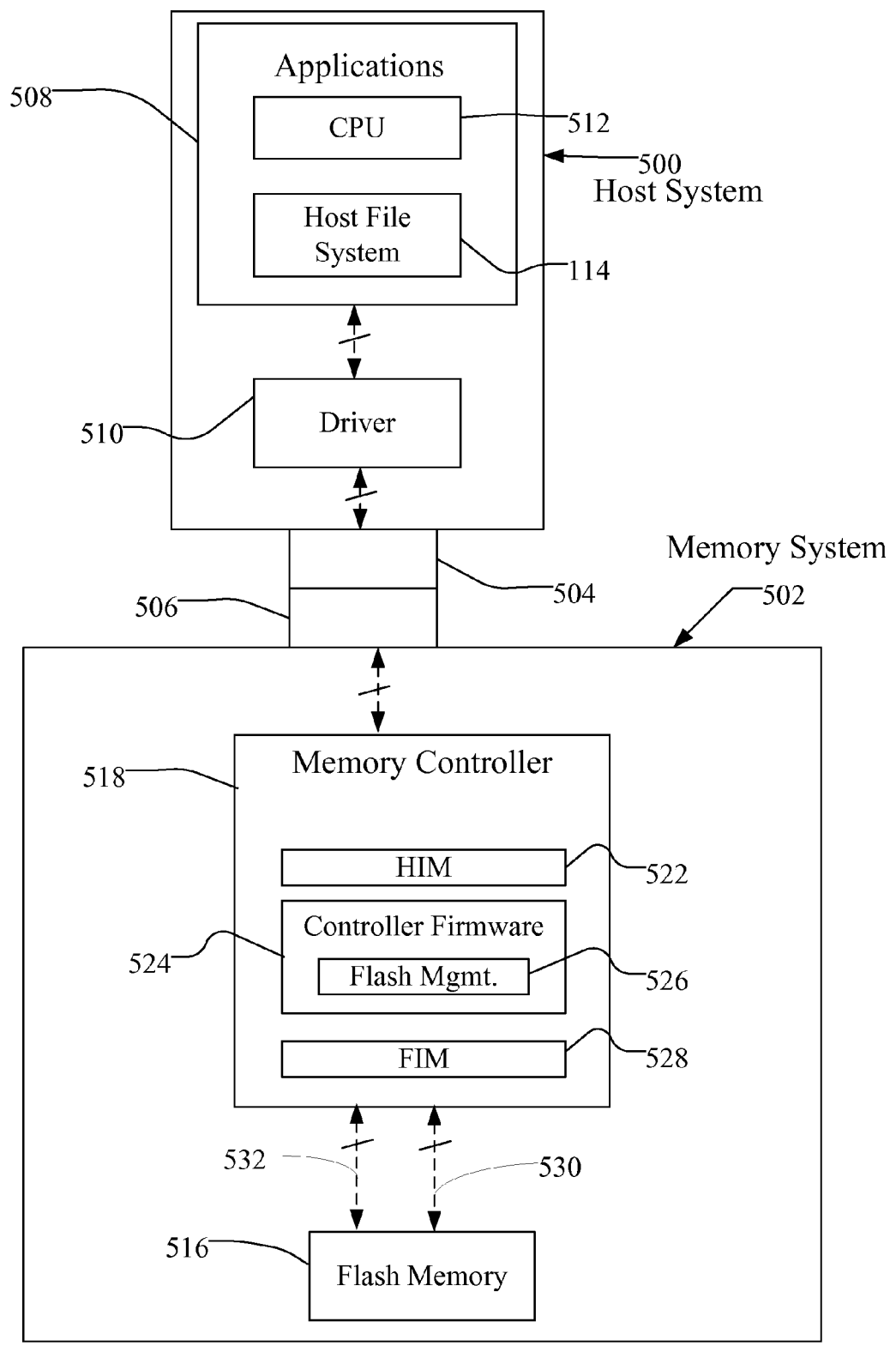
FIG. 5 is an exemplary block diagram of a system that may implement the system and methods described herein.

A system suitable for implementing methods and apparatus that control the relative timing between a DS signal and data is depicted in FIG. 5. A host system 500 of FIG. 5 stores data into and retrieves data from a memory system 502. The memory system 502 may be embedded within the host, such as in the form of a solid state disk (SSD) drive installed in a personal computer. Alternatively, the memory system 502 may be in the form of a flash memory card that is removably connected to the host through mating parts 504 and 506 of a mechanical and electrical connector as illustrated in FIG. 5. A memory system 502 configured for use as an internal or embedded SSD drive may look similar to the schematic of FIG. 5, with one difference being the location of the memory system 102 internal to the host. SSD drives may be in the form of discrete modules that are drop-in replacements for rotating magnetic disk drives. As described, flash memory may refer to the use of a negated AND (NAND) cell that stores an electronic charge.

Examples of commercially available removable flash memory cards include the CompactFlash (CF), the MultiMediaCard (MMC), Secure Digital (SD), miniSD, Memory Stick, SmartMedia, TransFlash, and microSD cards. Although each of these cards may have a unique mechanical and/or electrical interface according to its standardized specifications, the flash memory system included in each may be similar. These cards are all available from SanDisk Corporation, assignee of the present application. SanDisk also provides a line of flash drives under its Cruzer trademark, which are hand held memory systems in small packages that have a Universal Serial Bus (USB) plug for connecting with a host by plugging into the host's USB receptacle. Each of these memory cards and flash drives includes controllers that interface with the host and control operation of the flash memory within them.

Host systems that may use SSDs, memory cards and flash drives are many and varied. They include personal computers (PCs), such as desktop or laptop and other portable computers, tablet computers, cellular telephones, smartphones, personal digital assistants (PDAs), digital still cameras, digital movie cameras, and portable media players. For portable memory card applications, a host may include a built-in receptacle for one or more types of memory cards or flash drives, or a host may require adapters into which a memory card is plugged. The memory system may include its own primary controller and drivers but there may also be some memory-only systems that are instead controlled by software executed by the host to which the memory is connected. In some memory systems containing the controller, especially those embedded within a host, the memory, controller and drivers are often formed on a single integrated circuit chip. The host may communicate with the memory card using any communication protocol such as but not limited to Secure Digital (SD) protocol, Memory Stick (MS) protocol and Universal Serial Bus (USB) protocol.

The host system 500 of FIG. 5 may be viewed as having two major parts, insofar as the memory system 502 is concerned, made up of a combination of circuitry and software. An applications portion 508 may interface with the memory system 502 through a file system module 514 and driver 510. In a PC, for example, the applications portion 508 may include a processor 512 for running word processing, graphics, control or other popular application software. In a camera, cellular telephone that is primarily dedicated to performing a single set of functions, the applications portion 108 may be implemented in hardware for running the software that operates the camera to take and store pictures, the cellular telephone to make and receive calls, and the like.

The memory system 502 of FIG. 5 may include non-volatile memory, such as flash memory 516, and a memory controller 518 that both interfaces with the host 500 to which the memory system 502 is connected for passing data back and forth and controls the memory 516. The memory controller 518 may be implemented on a single integrated circuit chip, such as an application specific integrated circuit (ASIC). The memory controller 518 may include a multi-thread processor capable of communicating via a memory interface 528 having I/O ports for each memory bank in the flash memory 516. Memory controller 518 may communicate with a controller (not shown) of memory 516 via a data bus 530 and a control bus 532. The data bus 530 may correspond to the data bus 106 of FIG. 1 and control bus 532 may include DQS line 108. In an exemplary embodiment, memory controller 518 may implement methods that control the impedance of the data bus 530 and that control the relative timing between signals communicated via the control bus 532 and the data bus 530.

Figure 6:
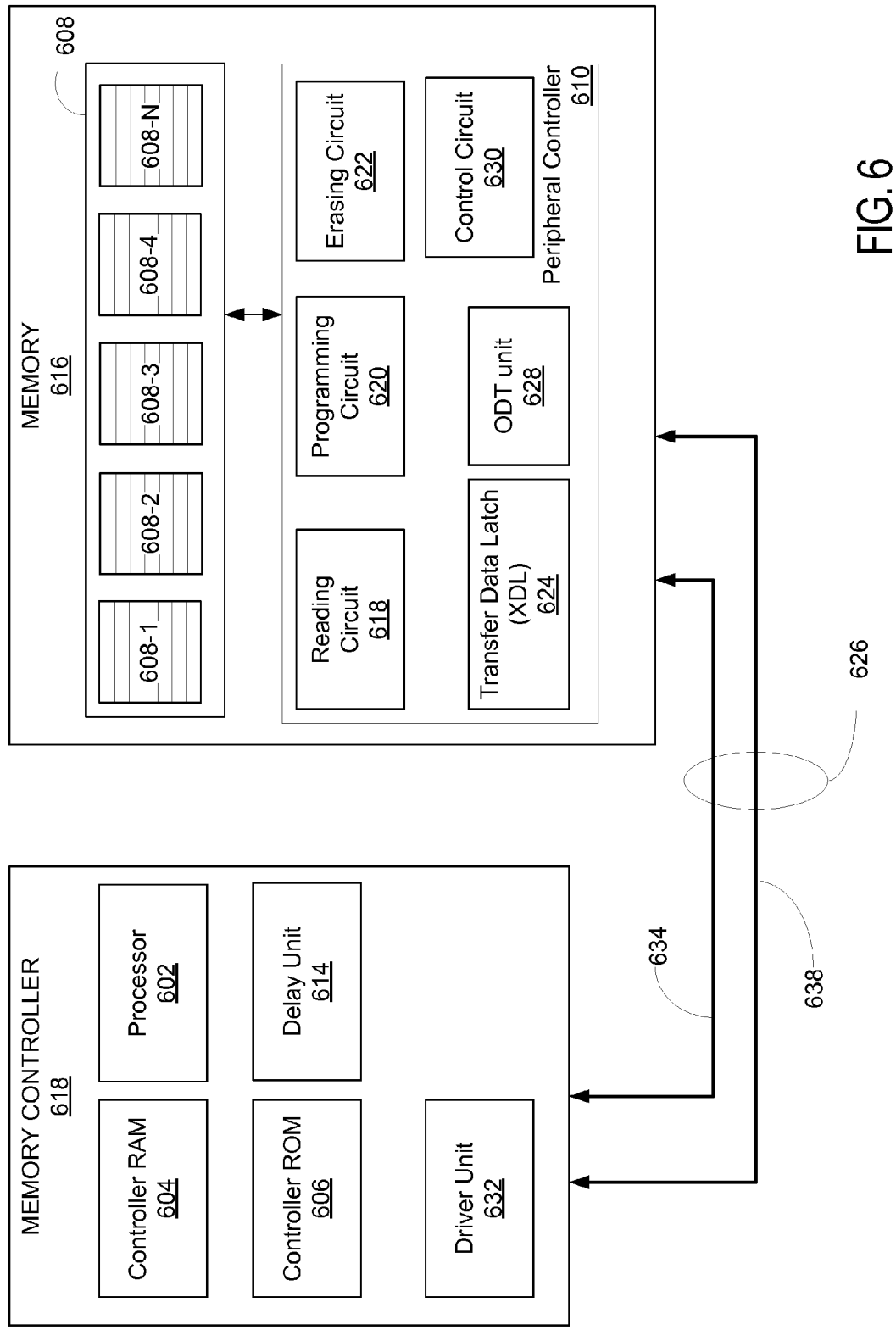
FIG. 6 is block diagram of an example memory system that implements methods to improve the rate at which data can be stored in the memory system.

FIG. 6 is a block diagram of an exemplary memory system 600. In an embodiment, memory system 600 may correspond to the memory system 502 of FIG. 5. In this embodiment, the memory system 600 comprises a memory controller 618 and memory 616. The memory controller 618 and the memory 616 may be coupled by an interface 626 comprising a data bus 634 and control lines 638. Memory controller 618 may utilize toggle mode to read from and write data to memory 616 via interface 626. The data bus 634 may correspond to data bus 106 of FIG. 1, in an embodiment. In another embodiment, control lines 630 may correspond to the WEn line 122, REn line 124 and DQS line 108 of FIG. 1. In an embodiment, WEn line 122 and REn line 124 are activated to effectuate data and command transfers via data bus 634 between memory controller 618 and memory 616 in legacy mode. In this embodiment, DQS line 108 is activated to effectuate data transfers via data bus 634 between memory controller 618 and memory 616 in toggle mode. In an embodiment, commands generated by the memory controller 618 may be communicated to the memory 616 via data bus 634. Commands may include commands to write data to memory 616, read data from memory 616 or commands to control the operation of the interface 626. In an exemplary embodiment, a command may include a command to switch between legacy and toggle mode of operation. In this embodiment, a set of commands may also include commands that may be used to perform toggle mode receive path and transmit path tuning of the interface 626.

By way of example and without limitation, in an embodiment, memory controller 618 includes a processor 602, controller RAM 604, controller ROM 606 and delay unit 214 and driver unit 632. The processor 602 may comprise a microprocessor, a microcontroller, an application specific integrated circuit (ASIC), a field programmable gate array, a logical digital circuit, or other now known or later developed logical processing capability. Memory controller 618 may correspond to primary controller 102 of FIG. 1, in an embodiment.

Controller ROM 606 may store software instructions that processor 602 may execute to control the operation of memory system 600. In an embodiment, controller ROM 606 may also store software instructions corresponding to perform read and write tuning of the interface between memory controller 618 and memory 616. In an embodiment, controller ROM 606 may also include instructions that when executed by processor 602 perform the functionality logically ascribed to HIM 522, controller firmware 524 and FIM 528.

In an exemplary embodiment, memory 618 includes non-volatile memory 608 and peripheral controller 610. In a preferred embodiment, non-volatile memory 608 comprises NAND flash memory. In this embodiment, non-volatile memory 608 is organized as N memory blocks 608-1 to 608-N. A memory block is organized as a set of memory pages or simply pages. A page is a smallest unit of writing in the memory 608 and a memory block is the smallest unit of erasing. Thus, data is typically programmed or stored on a page by page basis. However, erasing data programmed in a page requires erasure of all the pages in the memory block. Data received from the host system 500 is typically programmed or stored in an erased memory page.

Each page consists of a set of single-level cell (SLC) or multi-level cell (MLC). A SLC memory can store a single bit of data per cell. MLC memory can store multiple bits of data per cell. For example, two-level MLC memory can store 2 bits of data per cell, three level MLC memory can store 3 bits of data per cell and N level MLC memory can store N bits of data per cell. Typical sizes of memory pages are 16 Kilobytes (Kbytes). A memory block, 608-1 for example, typically consists of hundreds of memory pages. In describing exemplary embodiments herein, the term "cell" is used to refer to both SLC and MLC. A memory cell can be in an erased state or a programmed state. A memory page with memory cells in an erased state may be referred to as an erased memory page.

In an embodiment, peripheral controller 610 includes programming circuit 620, reading circuit 618, erasing circuit 622, control circuit 630, ODT unit 628 and transfer data latch (XDL) 624. The XDL 624 functions as intermediate data storage between memory controller 618 and memory 616. ODT unit 628 may be comprised of several ODTs 308 with each ODT connected with a respective data line and DQS 108.

In an embodiment, the reading circuit 618 of FIG. 2 translates the amount of charge stored in a memory cell to a binary representation of the data corresponding to the amount of charge stored in the cell. By way of example and without limitation, the reading circuit 618 may include current to voltage convertors, amplifiers and analog to digital convertors.

The programming circuit 620 of FIG. 6 translates the binary representation of data received from host system 500 into programming voltages and periods. The programming circuit applies these programming voltages for the periods programming periods to memory cells to cause the memory cells to store electric charge. The amount of stored electric charge is representative of the binary representation of the received data.

Writing the data to XDL 624 may be performed via data bus 634. Separately, memory controller 618 may control the writing of the data by activating control lines 638. Data may be written via data bus 634 in toggle mode as described above. Reading data may also be performed via the data bus 634 by activating control lines 634, DQS line 108 for example, in toggle mode.

In an embodiment, control circuit 630 is configured to interpret previously described commands received from the memory controller 518. In an exemplary embodiment, in response to being instructed by host system 500 to write data to memory 608, memory controller 618 may issue a write command via data bus 634. The memory controller 618 may subsequently write the data to XDL 624. The control circuit 630 may interpret the received command as a write command and cause the programming circuit 620 to write the data from XDL 624 to an appropriate memory block and erased memory page of non-volatile memory 608. Similarly, when instructed to read data from a specified memory page, memory controller 618 may issue a read command. The control circuit 630 may interpret the received command as a read command and cause reading circuit 618 to reads data from the specified memory page into the XDL 624 and memory controller 518 transfers the read data from the XDL 624 to controller RAM 604. The exchange of data may be performed using legacy mode or toggle mode or a combination thereof. For example, data may be read using the toggle mode and writing of data may be performed using the legacy mode.

In an exemplary embodiment, memory controller 618 may issue commands to perform receive path tuning and transmit path tuning. In response to receiving a receive path tuning command, for example, the control circuit 630 may interpret the received command as a receive path tuning command and enter into a tuning mode as described below with reference FIG. 7.

Figure 7:
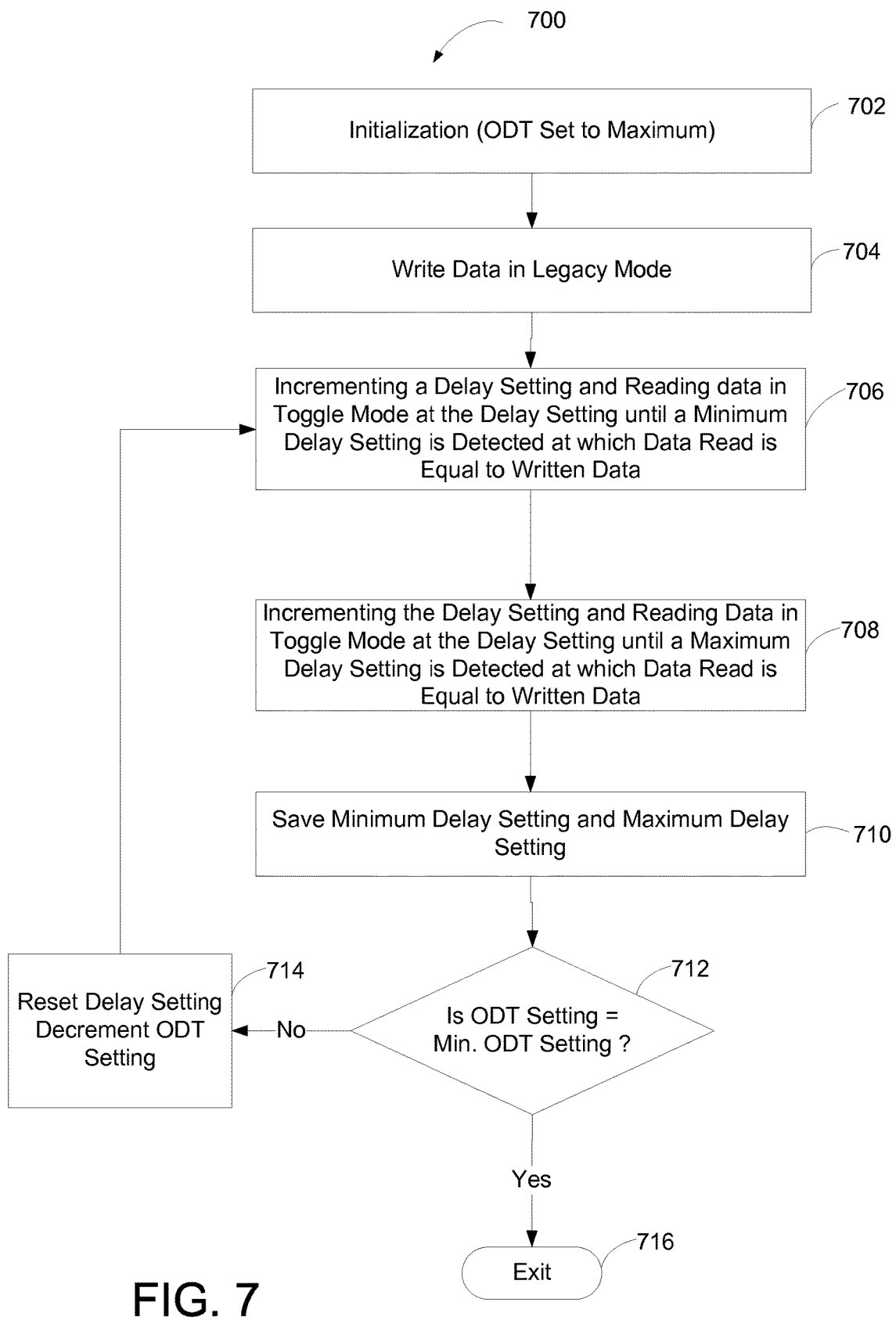
FIG. 7 is flow diagram of an exemplary method that may perform toggle mode read tuning.

FIG. 7 is a flow diagram 700 of an exemplary method for performing toggle mode receive path tuning of an exemplary interface, 626 for example. Method 700 may be executed by memory controller 618, in an embodiment. Method 700 may be implemented as software instructions that may be stored in controller ROM 606 and executed by processor 602, in an embodiment. Embodiments where functional aspects of method 700 are implemented by hardware circuitry are contemplated. Software instructions constituting functionality ascribed to method 700 may be executed when the memory system 502, for example, is idle as in when the host system 500 is not reading from or writing to flash memory 516. In another embodiment, method 700 may be executed periodically. In yet another embodiment, method 700 may be executed in response to detected errors in the data when data is read or written using toggle mode.

Generally, method 700 may be executed to identify optimal settings of ODT unit 628 and delay unit 614 that result in the greatest eye 256 (FIG. 2) when performing toggle mode read operations. Optimization may be performed by recursively reading data in the toggle mode and adjusting the settings of ODT unit 628 and delay unit 614, as long as the read data is equal to the data previously written in legacy mode. In an embodiment, an objective of this method is to identify the highest impedance setting for ODT unit 628 that produces the largest eye 256 (i.e., the maximum difference between $t_{left}$ and $t_{right}$).

At block 702, receive path tuning may be initiated. In an embodiment, initiating read tuning may include sending a receive path tuning command by the memory controller 616 to memory 618 via data bus 634. In response to receiving the receive path tuning command, control circuit 630 may configure memory 616 to receive data written to XDL 624 in legacy mode and perform read back of data from XDL 624 in toggle mode. Separately, control circuit 630 may configure setting of ODT unit 628 in response to receiving commands from memory controller 618 to adjust the settings.

In an exemplary embodiment, delay unit 614 may have N possible settings from 0 to N, where 0 introduces no delay between communication of data via data bus 106 (FIG. 1) or data bus 106 and activation of DQS line 108 and a setting of N inserts a maximum delay between communication of data via data bus 106 (FIG. 1) or data bus 106 and activation of DQS line 108. In this embodiment, ODT unit 628 may have M possible impedance settings from 0, no impedance, to M, maximum impedance. At block 702, memory controller 618 may initialize several variables used to store values for ODT and delay settings of the ODT unit 628 and delay unit 614, respectively. By way of example, exemplary variables include the instant delay unit setting t and the instant ODT setting ODT. Instant delay unit setting t may be initialized to zero. Variable $t_{leftsetting}$ may be used to store the delay unit setting corresponding to $t_{left}$ that results in the largest eye is realized. Variable $t_{leftsetting}$ may be initialized to N. Variable $t_{rightsetting}$ may be used to store the delay unit setting corresponding to $t_{right}$ value that results in the largest eye and may be initialized to 0. Variable $ODT_{best}$ may be used to store the setting of the ODT unit 628 that results in the largest eye or window 256 (FIG. 2) for example. Variables t_l and t_r may be used to store instant delay unit settings applied to delay unit 400, for example, to delay transmission of DQ signal via DQS line 108. The several variables described herein may be stored in controller RAM 606, in an embodiment.

At block 702, ODT unit 628 and delay unit 614 may also be initialized. Memory controller 618 may instruct control circuit 630 to set the impedance element of ODT unit 628 to its maximum value M, in an embodiment. The variable ODT may be set to the value M. In another embodiment, initializing ODT unit 628 may include setting a variable impedance element to an intermediate value. In an embodiment, memory controller 618 may initialize delay unit 614 with the value of 0 to insert no delay between communication of data via data bus 106 (FIG. 1) or data bus 106 and activation of DQS line 108. The instant delay unit setting t may be initialized to 0.

At block 704, memory controller 618 may write data to XDL 624 via data bus 634 in legacy mode, in one embodiment. In an embodiment, memory controller 618 may write a single byte of data. In another embodiment, memory controller 618 may write a series of data bytes to several register location of XDL 624.

At block 706, memory controller 618 may read the data in toggle mode from XDL 624. The read data may be compared with the data written in legacy mode at block 704. If the read data does not match with the data written, the instant delay unit setting variable t may be incremented (t=t+1) and the setting of the delay unit 614 may be updated with the incremented t. This process of reading the data in toggle mode, comparing the read data, incrementing t and updating the setting of the delay unit 614 may be iteratively repeated until the data read in toggle mode matches the data written in legacy mode. This iterative process helps identifies the smallest delay that must be introduced by the delay unit 614 to allow data to be correctly read in toggle; mode. The setting of the delay unit 614 that introduces this delay is reflected by the value stored in incremented setting of the variable. The value of t may be stored in variable t_l.

At block 708, memory controller 618 may identify the largest setting of the delay unit 614 that allows the data to be correctly read back in toggle mode. The read data may be compared with the data written in legacy mode at block 704. If the read data matches with the data written at block 704, the instant delay unit setting variable t may be incremented (t=t+1) and the setting of the delay unit 614 may be updated with the incremented t. This process of reading the data in toggle mode, comparing the read data, incrementing t and updating the setting of the delay unit 614 may be iteratively repeated until the data read in toggle mode no longer matches the data written in legacy mode. This iterative process helps identifies the largest delay that may be introduced by the delay unit 614 and still allow data to be correctly read in toggle mode. The setting of the delay unit 614 that introduces this delay is reflected by the value stored in incremented setting of the variable. The value of t may be stored in variable t_r.

At block 710, the difference between the values stored in t_r and t_l may be compared with the difference between the values stored in $t_{rightsetting}$ and $t_{leftsetting}$. If the difference between the values stored in t_r and t_l is greater than the difference between the values stored in $t_{rightsetting}$ and $t_{leftsetting}$, the value of $t_{leftsetting}$ may be updated with the value of t_l and the value of $t_{rightsetting}$ may be updated with the value of t_r, in an embodiment. Separately, the variable $ODT_{best}$ may be updated to store the current setting of the ODT unit 628.

At block 712, the variable ODT that holds the current setting of the ODT unit 628 may be decremented. The value stored in variable ODT may be compared with the smallest setting (0) of the ODT unit 628. If the value stored in variable ODT is greater or equal to zero program flow may branch to block 714.

At block 714, the setting of the ODT unit 628 may be updated to reflect the decremented value stored in variable ODT. Memory controller 618 may instruct control circuit 630 to set the impedance element of ODT unit 628 to the new setting, in an embodiment. The instruction may be communicated in legacy mode. Separately, the setting of the delay unit 614 may be re-initialized to 0 or no delay. Program flow may branch to block 706 and the functionality ascribed to blocks 706, 708 and 710 may be performed with the new setting of the ODT unit 628.

At block 712, if is determined that the value stored in variable ODT is less than zero, program flow may branch to block 716. At block 716, the value of the variable ODT$_{best}$ may be saved. An optimal delay unit setting corresponding to the difference between the values stored in variables t$_{rightsetting}$ and t$_{leftsetting}$ divided by 2 may be determined.

$$\left(\frac{trightsetting - tleftsetting}{2}\right).$$

These setting may be utilized in all toggle mode write operation. In an exemplary embodiment, final values stored in variables t$_{rightsetting}$, t$_{leftsetting}$ and ODT$_{best}$ may be stored in controller ROM 604, for example.

Figure 8:
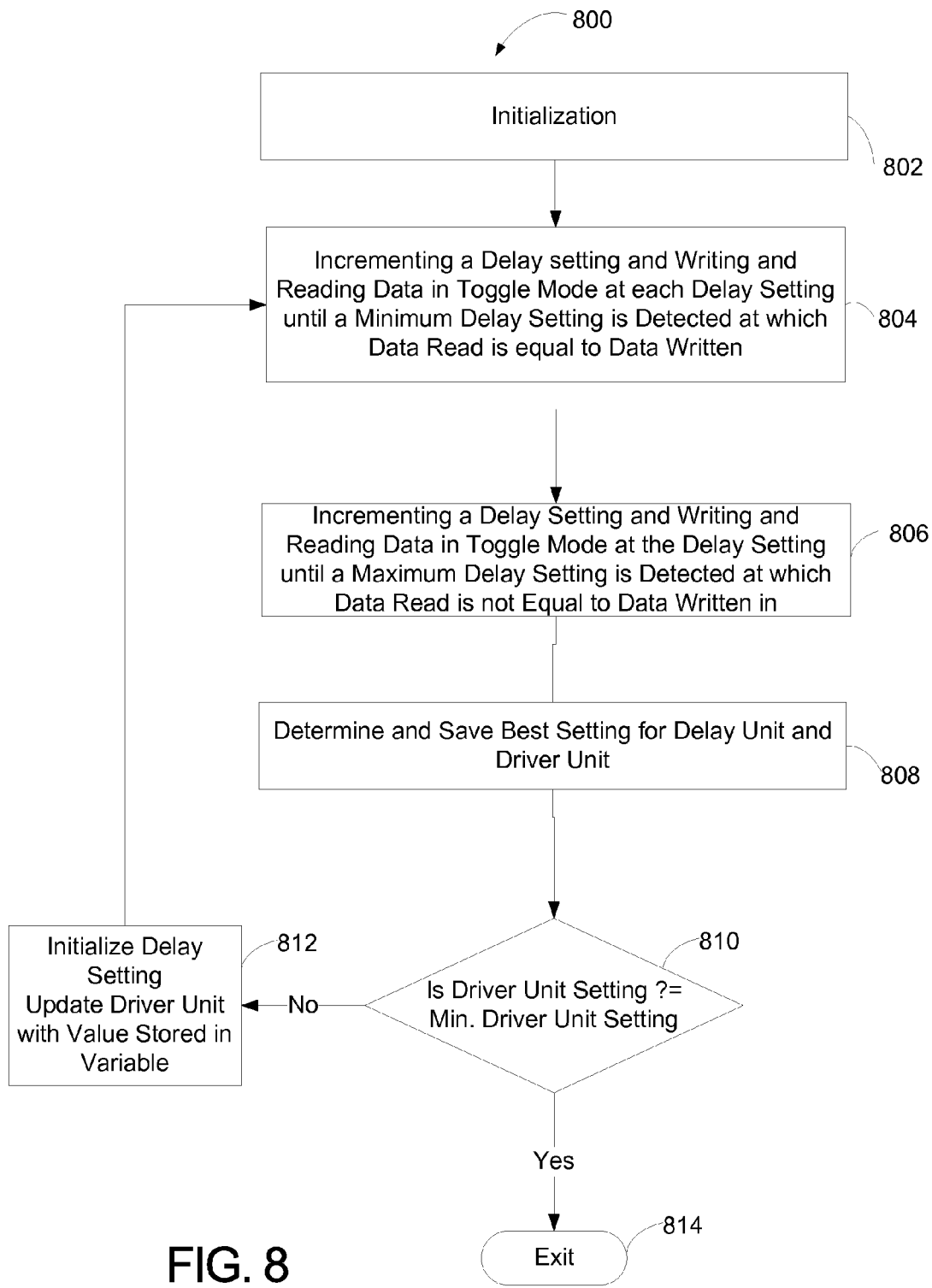
FIG. 8 is flow diagram of an exemplary method that may perform toggle mode write tuning.

FIG. 8 is a flow diagram 800 of an exemplary method for performing toggle mode transmit path tuning of an exemplary interface, 626 for example. Method 800 may be executed by memory controller 618, in an embodiment. Method 800 may be implemented as software instructions that may be stored in controller ROM 606 and executed by processor 602, in an embodiment. Embodiments where functional aspects of method 800 are implemented by hardware circuitry are contemplated. Software instructions constituting functionality ascribed to method 700 may be executed when the memory system 502, for example, is idle as in when the host system 500 is not reading from or writing to flash memory 516. In another embodiment, method 700 may be executed periodically. In yet another embodiment, method 800 may be executed in response to detected errors in the data when data is read or written using toggle mode.

Generally, method 800 may be executed to identify optimal settings of driver unit 632 and delay unit 614 that result in the greatest eye 256 when performing toggle mode write instructions. Optimization may be performed by recursively writing data in the toggle mode and adjusting the settings of driver unit 632 and delay unit 614, until the read data is equal to the data written. In an embodiment, an objective of this method is to identify the smallest setting for driver unit 632 that produces the largest eye 256 i.e. maximum difference between t$_{left}$ and t$_{right}$.

At block 802, transmit path tuning may be initiated. In an embodiment, initiating transmit path tuning may include sending a transmit path tuning command by the memory controller 616 to memory 618 via data bus 634. In response to receiving the receive path tuning command, control circuit 630 may configure memory 616 to receive data written to XDL 624 in toggle mode and perform read back of data from XDL 624 in toggle mode. Read back of data in toggle mode may be performed using by applying optimal delay setting and ODT settings derived using method 700 to delay unit 614 and ODT unit 628.

In an exemplary embodiment, delay unit 614 may have N possible settings from 0 to N, where 0 introduces no delay between communication of data via data bus 106 (FIG. 1) or data bus 106 and activation of DQS line 108 and a setting of N inserts a maximum delay between communication of data via data bus 106 (FIG. 1) or data bus 106 and activation of DQS line 108. In this embodiment, driver unit 632 may have M possible drive setting from 0, minimum current drive, to M, maximum current drive. At block 802, memory controller 618 may initialize several variables used to store values for driver and delay settings of the driver unit 632 and delay unit 614, respectively. By way of example, exemplary variables include the instant delay unit setting t and the instant driver setting DRV. Instant delay unit setting t may be initialized to zero. Variable t$_{leftsetting}$ may be used to store the delay unit setting corresponding to t$_{left}$ that results when the largest eye is realized. Variable t$_{leftsetting}$ may be initialized to N. Variable t$_{rightsetting}$ may be used to store the delay unit setting corresponding to t$_{right}$ value that results in the largest eye and may be initialized to 0. Variable DRV$_{best}$ may be used to store the setting of the driver unit 632 that results in the largest eye. Variables t_l and t_r may be used to store instant delay unit settings.

At block 802, driver unit 632 and delay unit 614 may also be initialized. The variable DRV may be set to the value M. In an embodiment, memory controller 618 may initialize delay unit 614 with the value of 0 to insert no delay between communication of data via data bus 106 (FIG. 1) or data bus 106 and activation of DQS line 108. The instant delay unit setting t may be initialized to 0.

At block 804, memory controller 618 may write data to the XDL 624 in toggle mode and read the data back in toggle mode from XDL 624. Toggle mode read back may be performed using optimal setting for ODT unit 626 and delay unit 614 identified at the conclusion of execution of method 700. For example, after writing data to XDL 624 in toggle mode, memory controller may set ODT unit 628 and delay unit 614 with values identified using method 700. The read data may be compared with the data written in toggle mode at block 804. If the read data does not match with the data written, the instant delay unit setting variable t may be incremented (t=t+1) and the setting of the delay unit 614 may be updated with the incremented t and data may be written to XDL 624 in toggle mode with the updated settings. This process of writing the data in toggle mode, reading the data in toggle mode, comparing the read data, incrementing t and updating the setting of the delay unit 614 may be iteratively repeated until the data read in toggle mode matches the data written in toggle mode. Of course before each toggle mode read, the settings of the delay unit 614 and ODT unit 628 may be set to values identified during receive path tuning (FIG. 7). This iterative process helps identifies the smallest delay that must be introduced by the delay unit 614 to allow data to be correctly written in toggle mode. The setting of the delay unit 614 that introduces this delay is reflected by the value stored in incremented setting of the variable. The value of t may be stored in variable t_l.

At block 806, memory controller 618 may identify the largest setting of the delay unit 614 that allows the data to be correctly read written in toggle mode. The read data may be compared with the data written in toggle mode at block 704. If the read data matches with the data written at block 704, the instant delay unit setting variable t may be incremented (t=t+1) and the setting of the delay unit 614 may be updated with the incremented t. This process of writing the data in toggle mode, reading the data in toggle mode, comparing the read data with the written data, incrementing t and updating the setting of the delay unit 614 may be iteratively repeated until the data read in toggle mode no longer matches the data written in toggle mode. This iterative process helps identifies the largest delay that may be introduced by the delay unit 614 and still allow data to be correctly read in toggle mode. The setting of the delay unit 614 that introduces this delay is reflected by the value stored in incremented setting of the variable. The value of t may be stored in variable t_r.

At block 808, the difference between the values stored in t_r and t_l may be compared with the difference between the values stored in $t_{rightsetting}$ and $t_{leftsetting}$. If the difference between the values stored in t_r and t_l is greater than the difference between the values stored in $t_{rightsetting}$ and $t_{leftsetting}$, the value of $t_{leftsetting}$ may be updated with the value of t_l and the value of $t_{rightsetting}$ may be updated with the value of t_r, in an embodiment. Separately, the variable $DRV_{best}$ may be updated to store the current setting of the driver unit 632. Additionally, in an embodiment, at block 810, the variable DRV that holds the current setting of the driver unit 628 may be decremented.

At block 810, value stored in variable DRV may be compared with the smallest setting (0) of the DRV unit 628. If the value stored in variable DRV is greater or equal to zero program flow may branch to block 812.

At block 812, the setting of the driver unit 632 may be updated to reflect the decremented value stored in variable DRV. Memory controller 618 may instruct control circuit 630 to set the impedance element of driver unit 632 to the new setting, in an embodiment. The instruction may be communicated in legacy mode. Separately, the setting of the delay unit 614 may be re-initialized to 0 or no delay. Program flow may branch to block 804 and the functionality ascribed to blocks 804, 806, 808 and 810 may be performed with the new setting of the driver unit 632.

At block 810, if is determined that the value stored in variable DRV is less than zero program flow may branch to block 816. At block 814, the value of the variable $DRV_{best}$ may be saved. An optimal delay unit setting corresponding to the difference between the values stored in variables $t_{rightsetting}$ and $t_{leftsetting}$ divided by 2 may be determined.

$$\left(\frac{trightsetting - tleftsetting}{2}\right).$$

The delay unit and the drive unit may be configured with these determined setting in all subsequent toggle mode write operation. In an exemplary embodiment, final values stored in variables $t_{rightsetting}$, $t_{leftsetting}$ and $DRV_{best}$ may be stored in controller ROM 604, for example.

In the foregoing discussion, an exemplary method 700 to perform receive path tuning of a toggle mode interface is disclosed. Receive path tuning consists of determining an ODT setting and delay unit settings that results in the largest window 256. For each ODT setting, minimum and maximum delay unit settings when data read is equal to the test written are determined. The ODT setting that produces the largest window 256 (i.e., the largest differences between the corresponding minimum and maximum delay unit settings) is selected for toggle mode read operation.

In the foregoing discussion, an exemplary method 800 to perform transmit path tuning of a toggle mode interface is disclosed. Transmit path tuning consists of determining a driver setting and delay unit settings that results in the largest window 256. For each driver setting, minimum and maximum delay unit settings when data read is equal to the test written are determined. The driver setting that produces the largest window 256 (i.e., the largest difference between the corresponding minimum and maximum delay unit settings) is selected for toggle mode write operation. Other programmatic arrangements for determining these settings are contemplated.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magneto-resistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

A "computer-readable medium," "machine readable medium," "propagated-signal" medium, and/or "signal-bearing medium" may comprise any device that includes, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection "electronic" having one or more wires, a portable magnetic or optical disk, a volatile memory such as a Random Access Memory "RAM", a Read-Only Memory "ROM", an Erasable Programmable Read-Only Memory (EPROM or Flash memory), or an optical fiber. A machine-readable medium may also include a tangible medium upon which software is printed, as the software may be electronically stored as an image or in another format (e.g., through an optical scan), then compiled, and/or interpreted or otherwise processed. The processed medium may then be stored in a computer and/or machine memory.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

We claim:

1. A method comprising:
   writing test data via a data bus to a storage location, wherein the data bus is coupled with a termination unit and a delay unit is coupled with a strobe line;

for each of a plurality of termination settings of the termination unit, wherein each of the plurality of termination settings presents a different impedance value:
   reading data from the storage location;
   identifying a range of delay settings for the delay unit where the read data is equal to the test data; and
   selecting the one of the plurality of termination settings having a corresponding greatest range of delay settings where the read data is equal to the test data.

2. The method of claim 1, further comprising, before writing the test data changing the termination setting to a highest impedance value of the plurality of impedance settings.

3. The method of claim 2, further comprising, after identifying a range of delay settings for the delay unit where the read data is equal to the test data changing the termination setting to another one of the plurality of termination settings that presents a lower impedance value than a previous termination setting.

4. The method of claim 1, wherein identifying the range of delay settings comprises detecting a minimum delay wherein detecting the minimum delay comprises incrementing the delay settings of the delay unit until the read data is equal to the test data.

5. The method of claim 4, wherein identifying the range of delay settings comprises detecting a maximum delay wherein detecting the maximum delay comprises incrementing the delay settings of the delay unit until the read data is not equal to the test data.

6. A method comprising:
   for each of a plurality of drive settings for a driver unit wherein each of the plurality of drive setting generates a different current drive:
      changing the drive setting to a highest current drive value of the plurality of drive settings;
      writing test data via a data bus to a storage location, wherein the data bus is coupled with the driver unit and a delay unit is coupled with a strobe line;
      reading data from the storage location via the data bus;
      between writing the test data and reading the data, incrementing a delay setting of the delay unit; and
      identifying a range of delay settings for the delay unit where the read data is equal to the test data; and
      selecting the one of the plurality of driver settings having a greatest range of delay settings.

7. The method of claim 6, further comprising, after identifying a range of delay settings for the delay unit where the read data is equal to the test data changing the drive setting to another one of the plurality of drive settings that generates a lower current drive value than a previous drive setting.

8. The method of claim 7, wherein identifying the range of delay settings comprises detecting a minimum delay wherein detecting the minimum delay comprises incrementing the delay settings of the delay unit until the read data is equal to the test data.

9. The method of claim 8, wherein identifying the range of delay settings comprises detecting a maximum delay wherein detecting the maximum delay comprises incrementing the delay settings of the delay unit until the read data is not equal to the test data.

10. A device comprising:
    a primary controller comprising a delay unit operable to delay the transmission of a strobe signal communicated by a strobe line, the delay unit characterized by a range of delay settings;
    a secondary controller, in communication with the primary controller via a data bus and the strobe line, the secondary controller comprising an on device termination (ODT) unit coupled with the data bus, the ODT unit operable to adjust an impedance of the data bus, the ODT unit characterized by a plurality of termination settings wherein each of the plurality of termination settings presents a different impedance value;
    the primary controller configured to:
       write test data via the data bus, to a storage location in the secondary controller;
       instruct the secondary controller to change the termination settings;
       at each of the plurality of termination settings, read data via the data bus from the storage location; and
       for each of the plurality of termination settings, identify a range of delay settings for the delay unit where the read data is equal to the test data; and
       select the one of the plurality of termination settings having a greatest range of delay settings.

11. The device of claim 10, wherein the primary controller is further configured to, after identifying a range of delay settings for the delay unit where the read data is equal to the test data, instruct the secondary controller to change the termination setting to another one of the plurality of termination settings that presents a lower impedance value than a previous termination setting.

12. The method of claim 11, wherein the primary controller is further configured to detect a minimum delay wherein detecting the minimum delay comprises incrementing the delay settings of the delay unit until the read data is equal to the test data.

13. The method of claim 12, wherein the primary controller is further configured to detect a maximum delay wherein detecting the maximum delay comprises incrementing the delay settings of the delay unit the read data is not equal to the test data.

14. The device of claim 10, wherein the primary controller is a memory controller for a non-volatile memory (NVM) and the secondary controller is part of the non-volatile memory (NVM).

15. The device of claim 14, wherein the storage location is a data transfer latch of the NVM.

16. A device comprising:
    a primary controller comprising:
       a delay unit operable to delay the transmission of a strobe signal communicated by the strobe line, the delay unit characterized by a range of delay settings; and
       a driver unit coupled with a data bus, the driver unit operable to adjust a respective current drive of the data bus, the driver unit characterized by a plurality of drive settings, wherein each of the plurality of drive setting generates a different current drive;
    a secondary controller, in communication with the primary controller via the data bus and strobe line,
    wherein the primary controller is configured to:
       write test data via the data bus, to a storage location in the secondary controller;
       change the drive setting;
       at each of the plurality of drive settings, read data via the data bus from the storage location; and
       for each of the plurality of drive settings, identify a range of delay settings for the delay unit where the read data is equal to the test data; and
       select the one of the plurality of termination settings having a greatest range of delay settings.

17. The device of claim 16, wherein the primary controller is further configured to, after identifying a range of delay settings for the delay unit where the read data is equal to the test data, change the drive setting to another one of the plurality of drive settings that presents a lower drive current than a previous drive current.

18. The method of claim 17, wherein the primary controller is further configured to detect a minimum delay wherein detecting the minimum delay comprises incrementing the delay settings of the delay unit until the read data is equal to the test data.

19. The method of claim 18, wherein the primary controller is further configured to detect a maximum delay wherein detecting the maximum delay comprises incrementing the delay settings of the delay unit the read data is not equal to the test data.

20. The device of claim 16, wherein the primary controller is a memory controller for a non-volatile memory (NVM) and the secondary controller is part of the non-volatile memory (NVM).

21. The device of claim 20, wherein the storage location is a data transfer latch of the NVM.

22. The device of claim 21, wherein the NVM is a 3-dimensional (3D) memory.

* * * * *